(12) United States Patent
Suto et al.

(10) Patent No.: US 10,844,175 B2
(45) Date of Patent: Nov. 24, 2020

(54) POLYAMIDE ACID, THERMOPLASTIC POLYIMIDE, RESIN FILM, METAL-CLAD LAMINATE AND CIRCUIT BOARD

(71) Applicant: NIPPON STEEL Chemical & Material Co., Ltd., Tokyo (JP)

(72) Inventors: Yoshiki Suto, Tokyo (JP); Teppei Nishiyama, Tokyo (JP)

(73) Assignee: NIPPON STEEL Chemical & Material Co., Ltd., Tokyo (JP)

( * ) Notice: Subject to any disclaimer, the term of this patent is extended or adjusted under 35 U.S.C. 154(b) by 0 days.

(21) Appl. No.: 16/085,596

(22) PCT Filed: Feb. 23, 2017

(86) PCT No.: PCT/JP2017/006884
§ 371 (c)(1),
(2) Date: Sep. 17, 2018

(87) PCT Pub. No.: WO2017/159274
PCT Pub. Date: Sep. 21, 2017

(65) Prior Publication Data
US 2019/0100624 A1    Apr. 4, 2019

(30) Foreign Application Priority Data

Mar. 17, 2016   (JP) ................. 2016-054299

(51) Int. Cl.
| | | |
|---|---|---|
| *C08G 73/10* | (2006.01) | |
| *B32B 15/088* | (2006.01) | |
| *H05K 1/03* | (2006.01) | |
| *B32B 27/34* | (2006.01) | |
| *C09D 179/08* | (2006.01) | |
| *C08L 77/10* | (2006.01) | |
| *H01B 3/30* | (2006.01) | |
| *H05K 1/05* | (2006.01) | |
| *C08K 3/22* | (2006.01) | |
| *C08K 3/28* | (2006.01) | |
| *C08K 3/36* | (2006.01) | |

(52) U.S. Cl.
CPC ........ *C08G 73/1078* (2013.01); *B32B 15/088* (2013.01); *B32B 27/34* (2013.01); *C08G 73/1007* (2013.01); *C08G 73/1042* (2013.01); *C08G 73/1071* (2013.01); *C08L 77/10* (2013.01); *C09D 179/08* (2013.01); *H01B 3/305* (2013.01); *H05K 1/03* (2013.01); *H05K 1/0346* (2013.01); *H05K 1/056* (2013.01); *C08K 3/22* (2013.01); *C08K 3/28* (2013.01); *C08K 3/36* (2013.01); *C08K 2003/222* (2013.01); *C08K 2003/2227* (2013.01); *C08L 2203/206* (2013.01)

(58) Field of Classification Search
CPC ................................................. C08G 73/1042
See application file for complete search history.

(56) References Cited

U.S. PATENT DOCUMENTS

| | | | | |
|---|---|---|---|---|
| 2006/0054589 | A1* | 3/2006 | Omori ..................... | B32B 15/08 216/13 |
| 2006/0204734 | A1* | 9/2006 | Watanabe .......... | C08G 73/1042 428/209 |
| 2008/0305316 | A1* | 12/2008 | Kaneshiro ............... | B32B 15/08 428/220 |
| 2015/0373843 | A1* | 12/2015 | Kim ........................ | B32B 15/08 428/141 |

FOREIGN PATENT DOCUMENTS

| | | |
|---|---|---|
| JP | 61143434 | 7/1986 |
| JP | 62208690 | 9/1987 |
| JP | 04334089 | 11/1992 |
| JP | 05105755 | 4/1993 |
| JP | 07029670 | 1/1995 |

(Continued)

OTHER PUBLICATIONS

Machine Translation of JP S61143434 (Year: 2019).*

(Continued)

*Primary Examiner* — Michael M Dollinger
(74) *Attorney, Agent, or Firm* — JCIPRNET

(57) ABSTRACT

A polyamide acid which contains at least one diamine compound selected from among diamine compounds represented by general formula (8) within the range of 3-60 parts by mole in total per 100 parts by mole of all diamine components, while containing a biphenyl tetracarboxylic acid dianhydride within the range of 40-100 parts by mole and a pyromellitic acid dianhydride within the range of 0-60 parts by mole per 100 parts by mole of all acid anhydride components; and a thermoplastic polyimide which is obtained curing this polyamide acid.

$$H_2N-\underset{}{\underset{}{\bigcirc}}^{(Y)_p}-\left[X-\underset{}{\underset{}{\bigcirc}}^{(Y)_q}\right]_n-NH_2 \quad (8)$$

(In formula (8), linking group X represents a single bond or a divalent group selected from among —CONH—; each Y independently represents a hydrogen atom, a monovalent hydrocarbon group having 1-3 carbon atoms or an alkoxy group; n represents an integer of 0-2; and each of p and q independently represents an integer of 0-4.)

18 Claims, No Drawings

(56) References Cited

FOREIGN PATENT DOCUMENTS

| | | |
|---|---|---|
| JP | 07125134 | 5/1995 |
| JP | 07300526 | 11/1995 |
| JP | 10204437 A * | 8/1998 |
| JP | 2000119419 | 4/2000 |
| JP | 2006248142 | 9/2006 |
| JP | 2006278371 | 10/2006 |
| JP | 2007203505 | 8/2007 |
| JP | 2010125793 | 6/2010 |
| JP | 4652020 | 3/2011 |
| JP | 2012076278 | 4/2012 |
| JP | 5031639 | 9/2012 |
| JP | 2015515402 | 5/2015 |
| KR | 20150058835 | 5/2015 |

OTHER PUBLICATIONS

Machine Translation of JP 2009246201 (Year: 2019).*
Machine Translation of JP 2000119419 (Year: 2019).*
"International Search Report (Form PCT/ISA/210)", dated May 23, 2017, with English translation thereof, pp. 1-4.
"Office Action of Taiwan Counterpart Application", dated May 27, 2020, with English translation thereof, p. 1-p. 9.
Office Action of China Counterpart Application, with English translation thereof, dated Mar. 16, 2020, pp. 1-11.

* cited by examiner

POLYAMIDE ACID, THERMOPLASTIC POLYIMIDE, RESIN FILM, METAL-CLAD LAMINATE AND CIRCUIT BOARD

CROSS-REFERENCE TO RELATED APPLICATION

This application is a 371 application of the International PCT application serial no. PCT/JP2017/006884, filed on Feb. 23, 2017, which claims the priority benefit of Japan Patent Application No. 2016-054299, filed on Mar. 17, 2016. The entirety of each of the abovementioned patent applications is hereby incorporated by reference herein and made a part of this specification.

TECHNICAL FIELD

The present invention relates to a polyimide that is useful as an adhesive layer in a circuit board such as a flexible printed wiring board and use thereof.

BACKGROUND ART

In recent years, along with advances in reductions in size and weight, and space saving in electronic devices, the demand for a flexible printed wiring board (flexible printed circuit (FPC)) that is thin and lightweight, has flexibility, and has excellent durability even if bending is repeated is increasing. Since FPCs can be mounted three-dimensionally and with a high density even in a limited space, applications thereof extend to components such as a wiring, a cable, and a connector of movable parts of electronic devices, for example, an HDD, a DVD, and a mobile phone.

Along with a higher density, wiring pitches in an FPC have become narrower, and microfabrication is necessary. Here, fine wiring processing is difficult unless a general copper foil having a low surface roughness is used as a wiring material. In addition, when the surface roughness of the copper foil is high, since the surface roughness is transferred to an insulating layer, there are problems of light being irregularly reflected at the surface of the insulating layer in an area in which the copper foil is removed by etching and a copper pattern not being recognized through the insulating layer.

In addition, as the performance of a device is improved, support for high frequency transmission signals is necessary. In information processing and info illation communication, in order to transmit and process large-capacity information, efforts to increase a transmission frequency are under way. For circuit board materials, a reduction in transmission loss according to thinning of an insulating layer and reductions in a dielectric constant and a dielectric loss tangent of the insulating layer are required. In the FPC using a polyimide in the related art, since a dielectric constant and a dielectric loss tangent are high, and a transmission loss is large in a high frequency range, adaptation to high frequency transmission is difficult. Therefore, an FPC in which a liquid crystal polymer having a low dielectric constant and a low dielectric loss tangent is used in a dielectric layer in order to support a high frequency is used. However, while a liquid crystal polymer has excellent dielectric properties, there is room for improvement in heat resistance and adhesion to a metal foil.

In order to improve dielectric properties and improve adhesion to a metal foil, a copper-clad laminate in which an imide group concentration of a polyimide layer in contact with a copper foil that forms a conductor circuit is controlled is proposed (Patent Literature 1). Patent Literature 1 describes that dielectric properties can be controlled according to a combination of a surface roughness Rz of a copper foil and a polyimide layer with a low imide group concentration on a surface in contact with the copper foil, but long-term heat resistant adhesion has not been sufficiently achieved.

A copper foil in which a predetermined metal is deposited on a surface of the copper foil in contact with an insulating layer in order to improve adhesion between the copper foil with a low surface roughness and the insulating layer is proposed (Patent Literature 2). Patent Literature 2 describes that, when an amount of nickel, zinc, and cobalt deposited is controlled, it is possible to secure an initial adhesive force and reduce a decrease in an adhesive force after a heat resistance test. However, in the copper foil of Patent Literature 2, since the insulating layer is formed of a non-thermoplastic polyimide resin, adhesion of the copper foil according to a lamination method is difficult and production methods and production conditions are limited.

CITATION LIST

Patent Literature

Patent Literature 1

Japanese Patent No. 5031639

Patent Literature 2

Japanese Patent No. 4652020

SUMMARY OF INVENTION

Technical Problem

In mounting of FPCs with a high density, in order to support wiring microfabrication, and in order to reduce irregular reflection of light at a surface of an insulating layer in an area in which a copper foil is removed by etching, a copper foil with a low surface roughness is effectively used. In addition, a phenomenon (skin effect) in which, while a high frequency signal is supplied to a signal wiring, current flows only on a surface of the signal wiring, an effective sectional area in which a current flows is smaller, a DC resistance increases, and a signal attenuates is known. When the surface roughness of a surface in contact with a polyimide insulating layer of the copper foil is reduced, an increase in the resistance of the signal wiring due to the skin effect can be reduced. However, when a low roughness copper foil whose surface roughness is reduced is used, there is a problem of the adhesion between the polyimide insulating layer and the copper foil being impaired.

An objective of the present invention is to provide a metal-clad laminate and a circuit board which include a polyimide adhesive layer that has excellent adhesion and long-term heat resistant adhesion with respect to a metal layer such as a copper foil, and in which a transmission loss can be reduced by lowering a dielectric loss tangent, and which can be suitably used for a high frequency circuit board.

Solution to Problem

In order to address the above problems, the inventors conducted studies and found that, when a polyimide having a specific structure is used for an adhesive layer, excellent adhesion and long-term heat resistant adhesion with respect to a low roughness copper foil are exhibited and a dielectric loss tangent can be reduced, and completed the present invention.

That is, the polyamide acid of the present invention is a polyamide acid obtained by reacting a diamine component with an acid anhydride component, wherein the diamine component includes at least one selected from among diamine compounds represented by the following general formulae (1) to (7) within the range of 40 to 97 parts by mole in total and at least one selected from among diamine compounds represented by the following general formula (8) within the range of 3 to 60 parts by mole in total with respect to 100 parts by mole of all diamine components, and wherein the acid anhydride component includes biphenyl tetracarboxylic acid dianhydride within the range of 40 to 100 parts by mole, and pyromellitic acid dianhydride within the range of 0 to 60 parts by mole with respect to 100 parts by mole of all acid anhydride components.

[Chem. 1]

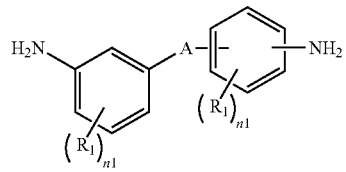
(1)

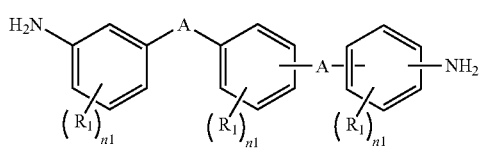
(2)

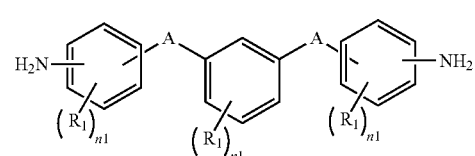
(3)

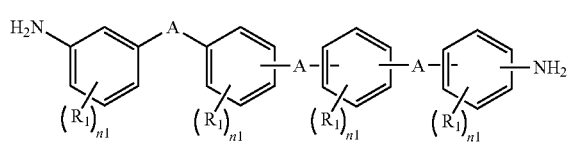
(4)

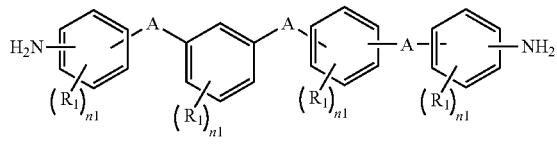
(5)

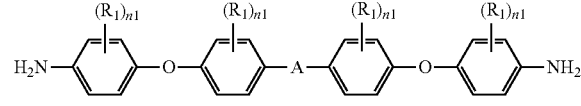
(6)

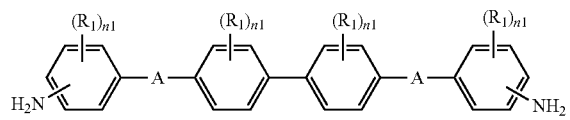
(7)

[in formulae (1) to (7), $R_1$ independently represents a monovalent hydrocarbon group having 1 to 6 carbon atoms or an alkoxy group, linking groups A independently represent a divalent group selected from among —O—, —S—, —CO—, —SO—, —SO$_2$—, —COO—, —CH$_2$—, —C(CH$_3$)$_2$—, —NH— and —CONH—, and $n_1$ independently represents an integer of 0 to 4, and here, parts in formula (3) that are the same as those in formula (2) are excluded, and parts in formula (5) that are the same as those in formula (4) are excluded]

[Chem. 2]

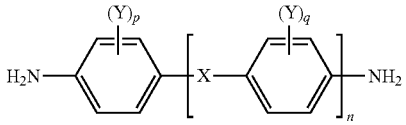
(8)

[in formula (8), a linking group X represents a single bond or a divalent group selected from among —CONH—, each Y independently represents hydrogen, a monovalent hydrocarbon group having 1 to 3 carbon atoms or an alkoxy group, n represents an integer of 0 to 2, and p and q independently represent an integer of 0 to 4]

The thermoplastic polyimide of the present invention is a thermoplastic polyimide that includes a diamine residue derived from a diamine component and a tetracarboxylic acid residue derived from an acid anhydride component, wherein the thermoplastic polyimide includes a diamine residue derived from at least one selected from among the diamine compounds represented by general formulae (1) to (7) within the range of 40 to 97 parts by mole in total and at least one diamine residue selected from among the diamine compounds represented by general formula (8) within the range of 3 to 60 parts by mole in total with respect to 100 parts by mole of all diamine residues, and wherein the thermoplastic polyimide includes a tetracarboxylic acid residue derived from biphenyl tetracarboxylic acid dianhydride within the range of 40 to 100 parts by mole and a tetracarboxylic acid residue derived from pyromellitic acid dianhydride within the range of 0 to 60 parts by mole with respect to 100 parts by mole of all tetracarboxylic acid residues.

The resin film of the present invention is a resin film including a single layer or a plurality of polyimide layers, wherein at least one layer among the polyimide layers is formed of the thermoplastic polyimide.

The metal-clad laminate of the present invention is a metal-clad laminate including an insulating resin layer and a metal layer, wherein the insulating resin layer includes a single layer or a plurality of polyimide layers, and wherein a polyimide layer in contact with the metal layer is formed of the thermoplastic polyimide.

In the metal-clad laminate of the present invention, a ten-point average roughness (Rz) of a surface of the metal layer in contact with the insulating resin layer may be within the range of 0.05 to 1.0 μm.

A circuit board of the present invention is obtained by processing the metal layer of the metal-clad laminate into wiring.

Advantageous Effects of Invention

The thermoplastic polyimide of the present invention has excellent adhesion and has a stronger adhesive force with respect to, for example, a low roughness copper foil. In addition, the thermoplastic polyimide of the present invention is thermoplastic, and an ordered structure is formed in the entire polymer according to a monomer-derived rigid structure. Therefore, it is possible to reduce a dielectric loss tangent, and the gas permeability can be lowered and excellent long-term heat resistant adhesion can be exhibited. Therefore, the resin film including the adhesive layer formed using the thermoplastic polyimide of the present invention has excellent adhesion with respect to the metal wiring layer.

In addition, when the thermoplastic polyimide layer is formed using the thermoplastic polyimide of the present invention, it is possible to reduce a dielectric loss tangent. Accordingly, the thermoplastic polyimide of the present invention can be suitably used as a material for producing an electronic component such as an FPC for which high density mounting, high speed signal transmission, and high reliability are required. In addition, the metal-clad laminate using the thermoplastic polyimide of the present invention can be applied to a circuit board such as an FPC through which a high frequency signal of, for example, 10 GHz or more, is transmitted.

DESCRIPTION OF EMBODIMENTS

Embodiments of the present invention will be described below.

[Polyamide Acid and Thermoplastic Polyimide]

<Polyamide Acid>

A polyamide acid of the present embodiment is a precursor of a thermoplastic polyimide of the present embodiment and is obtained by reacting a specific diamine component with an acid anhydride component.

<Thermoplastic Polyimide>

The thermoplastic polyimide of the present embodiment is obtained by imidizing the above polyamide acid and is produced by reacting a specific acid anhydride with a diamine. Therefore, when an acid anhydride and a diamine are mentioned, specific examples of the thermoplastic polyimide of the present embodiment are understood.

(Diamine Component)

A diamine component which is a raw material of the polyamide acid of the present embodiment includes at least one selected from among diamine compounds represented by the following general formulae (1) to (7) within the range of 40 to 97 parts by mole in total and at least one selected from among diamine compounds represented by the following general formula (8) within the range of 3 to 60 parts by mole in total with respect to 100 parts by mole of all diamine components.

[Chem. 3]

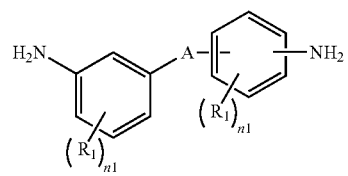

(1)

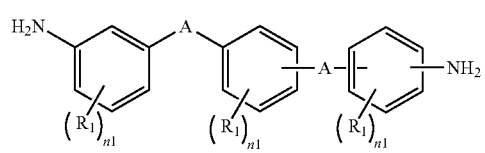

(2)

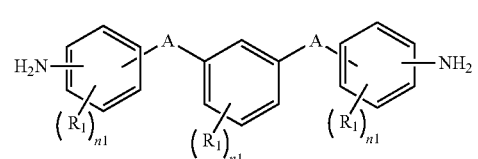

(3)

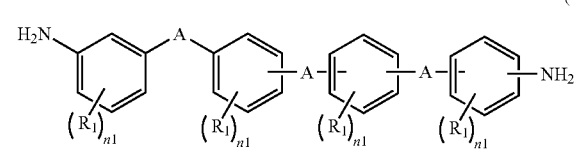

(4)

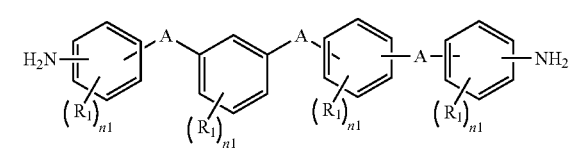

(5)

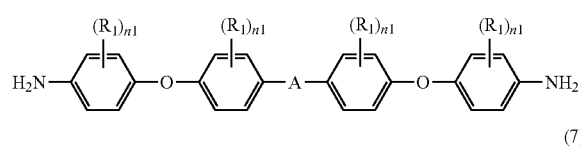

(6)

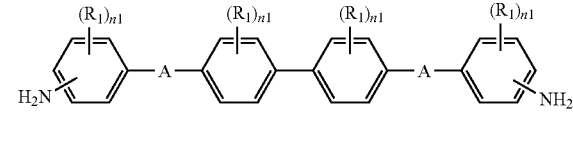

(7)

In formulae (1) to (7), $R_1$ independently represents a monovalent hydrocarbon group having 1 to 6 carbon atoms or an alkoxy group, linking groups A independently represent a divalent group selected from among —O—, —S—, —CO—, —SO—, —SO$_2$—, —COO—, —CH$_2$—, —C(CH$_3$)$_2$—, —NH— and —CONH—, and $n_1$ independently represents an integer of 0 to 4. However, parts in formula (3) that are the same as those in formula (2) are excluded and parts in formula (5) that are the same as those in formula (4) are excluded. Here, "independently" means that, in one or two or more of formulae (1) to (7), a plurality of linking groups A, a plurality of $R_1$ groups and a plurality of $n_1$ may be the same as or different from each other.

[Chem. 4]

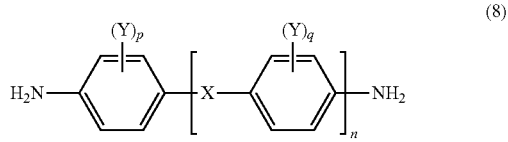

(8)

In formula (8), a linking group X represents a single bond or a divalent group selected from among —CONH—, each Y independently represents hydrogen, a monovalent hydrocarbon group having 1 to 3 carbon atoms or an alkoxy group, n represents an integer of 0 to 2, and p and q independently represent an integer of 0 to 4.

Here, in formulae (1) to (8), hydrogen atoms at two terminal amino groups may be substituted, and may be, for example, —NR$_2$R$_3$ (here, R$_2$ and R$_3$ independently represent an arbitrary substituent such as an alkyl group).

When diamine compounds represented by general formulae (1) to (7) are used in an amount within the above range, it is possible to improve the flexibility of a polyimide molecular chain and impart thermoplastic properties. When a total amount of the diamine compounds represented by general formulae (1) to (7) is less than 40 parts by mole with respect to 100 parts by mole of all diamine components, the flexibility of a polyimide resin is insufficient and sufficient thermoplastic properties are not obtained, and on the other hand, when a total amount of the diamine compounds represented by general formulae (1) to (7) exceeds 97 parts by mole with respect to 100 parts by mole of all diamine components, gas permeability becomes higher and the long-term heat resistance is lowered. A total amount of the diamine compounds represented by general formulae (1) to (7) is preferably within the range of 60 to 95 parts by mole with respect to 100 parts by mole of all diamine components.

In addition, when the diamine compound represented by general formula (8) is used in an amount within the above range, since an ordered structure is formed in the entire polymer due to a monomer-derived rigid structure, it is possible to reduce a dielectric loss tangent, and a polyimide which is thermoplastic and has a low gas permeability, and excellent long-term heat resistant adhesion is obtained. When a total amount of the diamine compound represented by general formula (8) is less than 3 parts by mole with respect to 100 parts by mole of all diamine components, it is difficult to form an ordered structure and the above actions and effects are not exhibited, and on the other hand, when a total amount of the diamine compound represented by general formula (8) exceeds 60 parts by mole with respect to 100 parts by mole of all diamine components, thermoplastic properties are impaired. A total amount of the diamine compound represented by general formula (8) is preferably within the range of 5 to 40 parts by mole with respect to 100 parts by mole of all diamine components.

Accordingly, the thermoplastic polyimide of the present embodiment includes a diamine residue derived from the diamine component and a tetracarboxylic acid residue derived from the acid anhydride component.

Thus, the thermoplastic polyimide of the present embodiment includes a diamine residue derived from at least one selected from among the diamine compounds represented by general formulae (1) to (7) within the range of 40 to 97 parts by mole in total and at least one diamine residue selected from among the diamine compounds represented by general formula (8) within the range of 3 to 60 parts by mole in total with respect to 100 parts by mole of all diamine residues.

In addition, the thermoplastic polyimide of the present embodiment includes a tetracarboxylic acid residue derived from biphenyl tetracarboxylic acid dianhydride within the range of 40 to 100 parts by mole and a tetracarboxylic acid residue derived from pyromellitic acid dianhydride within the range of 0 to 60 parts by mole with respect to 100 parts by mole of all tetracarboxylic acid residues.

The diamine represented by formula (1) (hereinafter referred to as a "diamine (1)" sometimes) is an aromatic diamine having 2 benzene rings. In the diamine (1), since an amino group directly connected to at least one benzene ring and a bivalent linking group A are at meta positions, the degree of freedom of the polyimide molecular chain increases and high flexibility is provided, which is thought to contribute to improving the flexibility of the polyimide molecular chain. Therefore, when the diamine (1) is used, thermoplastic properties of the polyimide are improved. Here, as the linking group A, —O—, —CH$_2$—, —C(CH$_3$)$_2$—, —CO—, —SO$_2$—, and —S— are preferable.

Examples of the diamine (1) include 3,3'-diaminodiphenylmethane, 3,3'-diaminodiphenylpropane, 3,3'-diaminodiphenyl sulfide, 3,3'-diaminodiphenyl sulfone, 3,3'-diaminodiphenyl ether, 3,4'-diaminodiphenyl ether, 3,4'-diaminodiphenylmethane, 3,4'-diaminodiphenylpropane, 3,4'-diaminodiphenyl sulfide, 3,3'-diaminobenzophenone, (3,3'-bisamino)diphenylamine, and the like.

The diamine represented by formula (2) (hereinafter referred to as a "diamine (2)" sometimes) is an aromatic diamine having 3 benzene rings. In the diamine (2), since an amino group directly connected to at least one benzene ring and a bivalent linking group A are at meta positions, the degree of freedom of the polyimide molecular chain increases and high flexibility is provided, which is thought to contribute to improving the flexibility of the polyimide molecular chain. Therefore, when the diamine (2) is used, thermoplastic properties of the polyimide are improved. Here, as the linking group A, —O— is preferable.

Examples of the diamine (2) include 1,4-bis(3-aminophenoxy)benzene, 3-[4-(4-aminophenoxy)phenoxy]benzenamine, 3-[3-(4-aminophenoxy)phenoxy]benzenamine, and the like.

The diamine represented by formula (3) (hereinafter referred to as a "diamine (3)" sometimes) is an aromatic diamine having 3 benzene rings. In the diamine (3), since two bivalent linking groups A directly connected to one benzene ring are at meta positions, the degree of freedom of the polyimide molecular chain increases and high flexibility is provided, which is thought to contribute to improving the flexibility of the polyimide molecular chain. Therefore, when the diamine (3) is used, thermoplastic properties of the polyimide are improved. Here, as the linking group A, —O— is preferable.

Examples of the diamine represented by formula (3) include 1,3-bis(4-aminophenoxy)benzene (TPE-R), 1,3-bis (3-aminophenoxy)benzene (APB), 4,4'-[2-methyl-(1,3-phenylene)bisoxy]bisaniline, 4,4'-[4-methyl-(1,3-phenylene) bisoxy]bisaniline, 4,4'-[5-methyl-(1,3-phenylene)bisoxy] bisaniline, and the like.

The diamine represented by formula (4) (hereinafter referred to as a "diamine (4)" sometimes) is an aromatic diamine having 4 benzene rings. In the diamine (4), since an amino group directly connected to at least one benzene ring and a bivalent linking group A are at meta positions, high flexibility is provided, which is thought to contribute to improving the flexibility of the polyimide molecular chain.

Therefore, when the diamine (4) is used, thermoplastic properties of the polyimide are improved. Here, as the linking group A, —O—, —CH$_2$—, —C(CH$_3$)$_2$—, —SO$_2$—, —CO—, and —CONH— are preferable.

Examples of the diamine represented by formula (4) include bis[4-(3-aminophenoxy)phenyl]methane, bis[4-(3-aminophenoxy)phenyl]propane, bis[4-(3-aminophenoxy)phenyl]ether, bis[4-(3-aminophenoxy)phenyl]sulfone, bis[4-(3-aminophenoxy)]benzophenone, bis[4,4'-(3-aminophenoxy)]benzanilide, and the like.

The diamine represented by formula (5) (hereinafter referred to as a "diamine (5)" sometimes) is an aromatic diamine having 4 benzene rings. In the diamine (5), since two bivalent linking groups A directly connected to at least one benzene ring are at meta positions, the degree of freedom of the polyimide molecular chain increases and high flexibility is provided, which is thought to contribute to improving the flexibility of the polyimide molecular chain. Therefore, when the diamine (5) is used, thermoplastic properties of the polyimide are improved. Here, —O— is preferable as the linking group A.

Examples of the diamine (5) include 4-[3-[4-(4-aminophenoxy)phenoxy]phenoxy]aniline, 4,4'-[oxybis(3,1-phenyleneoxy)]bisaniline, and the like.

The diamine represented by formula (6) (hereinafter referred to as a "diamine (6)" sometimes) is an aromatic diamine having 4 benzene rings. The diamine (6) has at least two ether bonds and thus has high flexibility, which is thought to contribute to improving the flexibility of the polyimide molecular chain. Therefore, when the diamine (6) is used, thermoplastic properties of the polyimide are improved. Here, as the linking group A, —C(CH$_3$)$_2$—, —O—, —SO$_2$—, and —CO— are preferable.

Examples of the diamine represented by formula (6) include 2,2-bis[4-(4-aminophenoxy)phenyl]propane (BAPP), bis[4-(4-aminophenoxy)phenyl]ether (BAPE), bis[4-(4-aminophenoxy)phenyl]sulfone (BAPS), bis[4-(4-aminophenoxy)phenyl]ketone (BAPK), and the like.

The diamine represented by formula (7) (hereinafter referred to as a "diamine (7)" sometimes) is an aromatic diamine having 4 benzene rings. The diamine (7) is thought to contribute to improving the flexibility of the polyimide molecular chain because it has a bivalent linking group A having high flexibility on both sides of a diphenyl framework. Therefore, when the diamine (7) is used, thermoplastic properties of the polyimide are improved. Here, as the linking group A, —O— is preferable.

Examples of the diamine represented by formula (7) include bis[4-(3-aminophenoxy)]biphenyl, bis[4-(4-aminophenoxy)]biphenyl, and the like.

The diamine represented by general formula (8) (hereinafter referred to as a "diamine (8)" sometimes) is an aromatic diamine having 1 to 3 benzene rings. Since the diamine (8) has a rigid structure, it has a function of imparting an ordered structure to the entire polymer. Therefore, when a combination of at least one of the diamine (1) to the diamine (7) and at least one of the diamines (8) at a predetermined ratio is used, it is possible to reduce a dielectric loss tangent, and a polyimide which is thermoplastic and has a low gas permeability, and excellent long-term heat resistant adhesion is obtained. Here, as the linking group X, a single bond and —CONH— are preferable.

Examples of the diamine (8) include para-phenylenediamine (PDA), 2,2'-dimethyl-4,4'-diaminobiphenyl (m-TB), 2,2'-n-propyl-4,4'-diaminobiphenyl (m-NPB), 2'-methoxy-4,4'-diaminobenzanilide (MABA), 4,4'-diaminobenzanilide (DABA), and the like.

(Acid Anhydride)

An acid anhydride component which is a raw material of the polyamide acid of the present embodiment includes biphenyl tetracarboxylic acid dianhydride within the range of 40 to 100 parts by mole, and preferably within the range of 50 to 100 parts by mole, and pyromellitic acid dianhydride within the range of 0 to 60 parts by mole, and preferably within the range of 0 to 50 parts by mole with respect to 100 parts by mole of all acid anhydride components. Here, examples of the biphenyl tetracarboxylic acid dianhydride include 3,3',4,4'-biphenyl tetracarboxylic acid dianhydride, 2,3',3,4'-biphenyl tetracarboxylic acid dianhydride, 2,2',3,3'-biphenyl tetracarboxylic acid dianhydride, and the like. When biphenyl tetracarboxylic acid dianhydride is used in the above range, since an ordered structure is formed due to a rigid structure, it is possible to reduce a dielectric loss tangent, and a polyimide which is thermoplastic and has a low gas permeability, and excellent long-term heat resistant adhesion is obtained. When there is less than 40 parts by mole of biphenyl tetracarboxylic acid dianhydride, it is difficult to form an ordered structure and the above actions and effects are not exhibited. Here, pyromellitic acid dianhydride is an optional component, but it is a monomer having a function of controlling a glass transition temperature.

In the present embodiment, acid anhydrides other than the above acid anhydrides can be included. Examples of other acid anhydrides include 3,3',4,4'-diphenylsulfone tetracarboxylic dianhydride, 4,4'-oxydiphthalic acid anhydride, 2,2', 3,3'-, 2,3,3',4'- or 3,3',4,4'-benzophenonetetracarboxylic dianhydride, 2,3',3,4'-diphenyl ether tetracarboxylic dianhydride, bis(2,3-dicarboxyphenyl)ether dianhydride, 3,3",4, 4"-, 2,3,3",4"- or 2,2",3,3"-p-terphenyltetracarboxylic dianhydride, 2,2-bis(2,3- or 3,4-dicarboxyphenyl)-propane dianhydride, bis(2,3- or 3,4-dicarboxyphenyl)methane dianhydride, bis(2,3- or 3,4-dicarboxyphenyl)sulfone dianhydride, 1,1-bis(2,3- or 3,4-dicarboxyphenyl)ethane dianhydride, 1,2,7,8-, 1,2,6,7- or 1,2,9,10-phenanthrenetetracarboxylic dianhydride, 2,3,6,7-anthracenetetracarboxylic dianhydride, 2,2-bis(3,4-dicarboxyphenyl)tetrafluoropropane dianhydride, 2,3,5,6-cyclohexane dianhydride, 2,3,6,7-naphthalenetetracarboxylic dianhydride, 1,2,5,6-naphthalenetetracarboxylic dianhydride, 4,5,8-naphthalenetetracarboxylic dianhydride, 4,8-dimethyl-1,2,3, 5,6,7-hexahydronaphthalene-1,2,5,6-tetracarboxylic dianhydride, 2,6- or 2,7-dichloronaphthalene-1,4,5,8-tetracarboxylic dianhydride, 2,3,6,7- (or 1,4,5,8-)tetrachloronaphthalene-1,4,5,8- (or 2,3,6,7-)tetracarboxylic dianhydride, 2,3,8,9-, 3,4,9,10-, 4,5,10,11- or 5,6,11,12-perylene-tetracarboxylic dianhydride, cyclopentane-1,2,3,4-tetracarboxylic dianhydride, pyrazine-2,3,5,6-tetracarboxylic dianhydride, pyrrolidine-2,3,4,5-tetracarboxylic dianhydride, thiophene-2,3,4,5-tetracarboxylic dianhydride, 4,4'-bis(2,3-dicarboxyphenoxy)diphenylmethane dianhydride, 2,2-bis[4-(3,4-dicarboxyphenoxy)phenyl]propane dianhydride, and the like.

In the thermoplastic polyimide of the present embodiment, when types of the above acid anhydride and diamine or respective molar ratios of two or more types of acid anhydride or diamine used are selected, it is possible to control thermal expansion, adhesion, a glass transition temperature (Tg), and the like.

The thermoplastic polyimide according to the present embodiment can be produced by reacting the diamine component and the acid anhydride component in a solvent, producing a polyamide acid, and then closing a ring by heating. For example, the acid anhydride component and the diamine component may be dissolved in substantially equimolar amounts in an organic solvent, stirring may be performed in a temperature range of 0 to 100° C. for 30 minutes to 24 hours, a polymerization reaction may be caused, and thereby a polyamide acid which is a precursor of the polyimide may be obtained. In the reaction, the reaction components are dissolved such that there is within the range of 5 to 30 weight %, preferably within the range of 10 to 20 weight % of the produced precursor in the organic solvent. Examples of the organic solvent used for the polymerization reaction include N,N-dimethylformamide (DMF), N,N-dimethylacetamide (DMAc), N,N-diethylacetamide, N-methyl-2-pyrrolidone (NMP), 2-butanone, dimethyl sulfoxide (DMSO), hexamethylphosphoramide, N-methyl caprolactam, dimethyl sulfate, cyclohexanone, dioxane, tetrahydrofuran, diglyme, triglyme, cresol, and the like. Two or more types of these organic solvent can be used in combination, and additionally, aromatic hydrocarbons such as xylene and toluene can be used in combination. In addition, an amount of such an organic solvent used is not particularly limited. However, preferably, an amount of such an organic solvent used is adjusted to that at which a concentration of a polyamide acid solution obtained by the polymerization reaction is about 5 to 30 weight %.

Generally, the synthesized polyamide acid is advantageously used as a reaction solvent solution, but it can be concentrated, diluted or substituted with another organic solvent as necessary. In addition, generally, since a polyamide acid is a solvent with which there is excellent solubility, it is advantageously used. The viscosity of the polyamide acid solution is preferably within the range of 500 cps to 100,000 cps. When the viscosity is outside of this range, defects such as thickness unevennesses and streaks are likely to occur in the film when a coating operation is performed by a coater or the like. A method of imidizing the polyamide acid is not particularly limited. For example, a heat treatment in which heating is performed under temperature conditions within the range of 80 to 400° C. for 1 to 24 hours in the solvent is suitably used.

For example, when the thermoplastic polyimide of the present embodiment is used for an adhesive layer in an insulating resin of a circuit board, in order to reduce diffusion of copper, a completely imidized structure is most preferable. However, a part of the polyimide may be a polyamide acid. An imidization rate thereof is calculated from the absorbance of C=O stretches derived from an imide group at 1,780 cm$^{-1}$ based on a benzene ring absorber in the vicinity of 1,015 cm$^{-1}$ by measuring an infrared absorption spectrum of a polyimide thin film by a single reflection ATR method using a Fourier transform infrared spectrophotometer (commercially available product: FT/IR620 commercially available from JASCO Corporation).

The weight average molecular weight of the thermoplastic polyimide of the present embodiment is, for example, preferably within the range of 10,000 to 400,000, and more preferably within the range of 50,000 to 350,000. When the weight average molecular weight is less than 10,000, the strength of the film decreases and the film is likely to become brittle. On the other hand, when the weight average molecular weight exceeds 400,000, the viscosity excessively increases, and defects such as film thickness unevenness and streaks are likely to occur during a coating operation.

[Resin Film]

A resin film of the present embodiment is not particularly limited as long as it is an insulating resin film having a polyimide layer formed of the thermoplastic polyimide of the present embodiment. The resin film may be a film (sheet) made of an insulating resin or a film of an insulating resin that is laminated on a substrate such as a copper foil, a glass plate, a resin sheet, for example, a polyimide type film, a polyamide type film, or a polyester type film. In addition, the thickness of the resin film of the present embodiment is preferably within the range of 3 to 100 μm, and more preferably within the range of 3 to 75 μm.

Since the thermoplastic polyimide of the present embodiment has high expandability, for example, it is suitably applied to an adhesive layer for a substrate such as a metal layer and another resin layer. For suitable use for such an adhesive polyimide layer, the thermoplastic polyimide of the present embodiment has a glass transition temperature (Tg) that is, for example, preferably 360° C. or lower or more preferably within the range of 200 to 320° C.

When the thermoplastic polyimide of the present embodiment is applied for an adhesive layer, for example, a low thermal expansion polyimide layer having a coefficient of thermal expansion (CTE) that is $30 \times 10^{-6}$ (1/K) or less, and preferably, within the range of $10 \times 10^{-6}$ to $30 \times 10^{-6}$ (1/K), may be applied as a base film layer. A polyimide that can be suitably used among low thermal expansion polyimides is a non-thermoplastic polyimide. The thickness of the base film layer with low thermal expansion is preferably within the range of 5 to 50 μm and more preferably within the range of 10 to 35 μm.

When the thermoplastic polyimide of the present embodiment is applied to, for example, an adhesive layer of a circuit board, a dielectric loss tangent (Tan δ) at 10 GHz is preferably 0.004 or less. If a dielectric loss tangent at 10 GHz exceeds 0.004, problems such as electrical signal loss along a high frequency signal transmission path are likely to occur in use for a circuit board such as an FPC. Here, a lower limit value of the dielectric loss tangent at 10 GHz is not particularly limited.

When the thermoplastic polyimide of the present embodiment is applied to, for example, an adhesive layer of a circuit board, in order to secure impedance matching, a dielectric constant at 10 GHz is preferably 4.0 or less. When a dielectric constant at 10 GHz exceeds 4.0, in use for a circuit board such as an FPC, dielectric loss deterioration is caused, and problems such as electrical signal loss along a high frequency signal transmission path are likely to occur.

A method of forming a polyimide film as the resin film of the present embodiment is not particularly limited. For example, there are [1] a method in which a polyamide acid solution is applied to a support substrate and dried and then imidization is performed to produce a polyimide film (hereinafter referred to as a casting method), and [2] a method in which a polyamide acid solution is applied to a support substrate and dried, a polyamide acid gel film is then peeled off from the support substrate, and imidization is performed to produce a polyimide film. In addition, when the polyimide film produced in the present embodiment is composed of a plurality of polyimide resin layers, a form of the production method includes, for example, [3] a method in which application of a polyamide acid solution to a support substrate and drying are repeated a plurality of times, and imidization is then performed (hereinafter referred to as a sequential coating method), and [4] a method in which a laminate structure of polyamide acid is simultaneously applied to a support substrate by multilayer extrusion and dried, and imidization is then performed (hereinafter referred to as a multilayer extrusion method). A method of applying a polyimide solution (or a polyamide acid solution) to a substrate is not particularly limited, and application can be performed by a coater, for example, a comma coater, a die, a knife, or a lip. When multiple polyimide layers are formed, a method in which operations of applying a polyimide solution (or a polyamide acid solution) to a substrate and performing drying are repeated is preferable.

The resin film of the present embodiment can include a single layer or a plurality of polyimide layers. In this case, at least one layer (preferably, an adhesive layer) among the polyimide layers may be formed using the thermoplastic polyimide of the present embodiment. For example, when a non-thermoplastic polyimide layer is set as P1 and a thermoplastic polyimide layer is set as P2, if a resin film is composed of two layers, it is preferable to perform lamination with a combination of P2/P1, and if a resin film is composed of three layers, it is preferable to perform lamination in an order of P2/P1/P2 or an order of P2/P1/P1. Here, P1 indicates a base film layer formed using the non-thermoplastic polyimide and P2 indicates an adhesive layer formed of the thermoplastic polyimide of the present embodiment.

The resin film of the present embodiment may include an inorganic filler in the polyimide layer as necessary. Specifically, for example, silicon dioxide, aluminum oxide, magnesium oxide, beryllium oxide, boron nitride, aluminum nitride, silicon nitride, aluminum fluoride, and calcium fluoride may be exemplified. These can be used alone or in a mixture of two or more thereof.

[Metal-Clad Laminate]

A metal-clad laminate of the present embodiment includes an insulating resin layer and a metal layer laminated on at least one side surface of the insulating resin layer. Examples of a preferable and specific example of the metal-clad laminate include a copper-clad laminate (CCL).

<Insulating Resin Layer>

In the metal-clad laminate of the present embodiment, the insulating resin layer includes a single layer or a plurality of polyimide layers. In this case, at least one layer (preferably, an adhesive layer) among the polyimide layers is formed using the thermoplastic polyimide of the present embodiment. Preferably, in order to increase the adhesion between the insulating resin layer and the metal layer, a layer of the insulating resin layers, which is in contact with the metal layer, is preferably an adhesive layer formed of the thermoplastic polyimide of the present embodiment. For example, when two insulating resin layers are formed, if the non-thermoplastic polyimide layer is set as P1, the thermoplastic polyimide layer is set as P2, and the metal layer is set as M1, it is preferable to perform lamination in an order of P1/P2/M1. Here, P1 indicates a base film layer formed using any non-thermoplastic polyimide and P2 indicates an adhesive layer formed of the thermoplastic polyimide of the present embodiment.

<Metal Layer>

A material of the metal layer in the metal-clad laminate of the present embodiment is not particularly limited. For example, copper, stainless steel, iron, nickel, beryllium, aluminum, zinc, indium, silver, gold, tin, zirconium, tantalum, titanium, lead, magnesium, manganese, and alloys thereof may be exemplified. Among these, particularly, copper or a copper alloy is preferable. Here, a material of a wiring layer in a circuit board of the present embodiment to be described below is the same as that of the metal layer.

While a high frequency signal is supplied to a signal wiring, there are problems (skin effect) of a current flowing only on a surface of the signal wiring, an effective sectional area in which current flows being smaller, a DC resistance increasing, and a signal attenuating. When the surface roughness of a surface of the metal layer such as a copper foil, which is in contact with the insulating resin layer, is reduced, it is possible to reduce an increase in the resistance of the signal wiring due to the skin effect. However, when the surface roughness is reduced in order to reduce an increase in the resistance, an adhesive force (peel strength) between the metal layer and the dielectric substrate becomes weaker. Thus, it is possible to reduce an increase in the resistance, and in order to secure adhesion with the insulating resin layer and improve the visibility of the metal-clad laminate, the surface roughness of the metal layer in contact with the insulating resin layer has a ten-point average roughness Rz that is preferably within the range of 0.05 to 1.0 μm and has an arithmetic average roughness Ra that is preferably 0.2 μm or less.

The metal-clad laminate may be produced when, for example, a resin film including the thermoplastic polyimide of the present embodiment is prepared, a metal is sputtered thereon to form a seed layer, and a metal layer is then formed by, for example, plating.

In addition, the metal-clad laminate may be produced when a resin film including the thermoplastic polyimide of the present embodiment is prepared, and a metal foil is laminated thereon by a method such as thermocompression bonding.

In addition, the metal-clad laminate may be produced when a coating solution containing a polyamide acid which is a precursor of the thermoplastic polyimide of the present embodiment is cast on a metal foil, drying is performed, a coating film is formed, imidization is then performed by a heat treatment, and a polyimide layer is formed.

[Circuit Board]

A circuit board of the present embodiment includes an insulating resin layer and a wiring layer formed on the insulating resin layer. In the circuit board of the present embodiment, the insulating resin layer can include a single layer or a plurality of polyimide layers. In this case, in order to impart excellent high frequency transmission characteristics to the circuit board, at least one layer (preferably, an adhesive layer) among the polyimide layers may be formed using the thermoplastic polyimide of the present embodiment. In addition, in order to increase the adhesion between the insulating resin layer and the wiring layer, a layer of the insulating resin layers, which is in contact with the wiring layer, is preferably an adhesive layer formed using the thermoplastic polyimide of the present embodiment. For example, when two insulating resin layers are used, if a non-thermoplastic polyimide layer is set as P1, a thermoplastic polyimide layer is set as P2, and a wiring layer is set as M2, it is preferable to perform lamination in an order of P1/P2/M2. Here, P1 indicates a base film layer formed using any non-thermoplastic polyimide and P2 indicates an adhesive layer formed of the thermoplastic polyimide of the present embodiment.

A method of producing a circuit board is not limited as long as the thermoplastic polyimide of the present embodiment is used. For example, a subtractive method in which a metal-clad laminate composed of an insulating resin layer including the thermoplastic polyimide of the present embodiment and a metal layer is prepared and the metal layer is etched to form a wiring may be used. In addition, a semi-additive method in which a seed layer is formed on a layer of the thermoplastic polyimide of the present embodiment, a resist is then pattern-formed, and additionally, a metal is pattern-plated to form a wiring may be used.

<Functions>

The diamine (1) to the diamine (7) used as monomers in the present embodiment all allow high flexibility, improve the flexibility of the polyimide molecular chain, and can impart improved thermoplastic properties. In addition, since the diamine (8) has a rigid structure, it has a function of imparting an ordered structure to the entire polymer. When such an ordered structure is formed, a dielectric loss tangent can be reduced and permeability of a gas such as oxygen which is a cause of lowering long-term heat resistant adhesion with a metal wiring layer is reduced. Therefore, when a combination of at least one of the diamine (1) to the diamine (7) and at least one of the diamines (8) at a predetermined ratio is used, a polyimide which forms a thermoplastic resin, and can reduce a dielectric loss tangent, has a low gas permeability, and has excellent long-term heat resistant adhesion is obtained. In this manner, a polyimide which is thermoplastic and has high adhesion, and exhibits excellent long-term heat resistant adhesion according to low gas permeability due to the ordered structure has been realized for the first time according to the present invention. Here, a formation degree of the ordered structure of the polyimide can be estimated from changes in the total light transmittance and haze in a film state as shown in the following examples.

As described above, since the polyimide of the present embodiment is thermoplastic, it has excellent adhesion with respect to a low roughness copper foil. In addition, since the polyimide of the present embodiment is thermoplastic and an ordered structure is formed in the entire polymer according to a monomer-derived rigid structure, it is possible to reduce a dielectric loss tangent, reduce gas permeability and obtain excellent long-term heat resistant adhesion. Therefore, a resin film including an adhesive layer formed using the thermoplastic polyimide of the present embodiment has excellent adhesion with respect to a metal wiring layer and can be suitably used as a material for producing an electronic component such as an FPC for which high density mounting and high reliability are required.

EXAMPLES

Examples will be described below and features of the present invention will be described in more detail. However, the scope of the present invention is not limited to the examples. Here, in the following examples, unless otherwise specified, various measurements and evaluations are as follows.
[Measurement of Viscosity]

For measurement of the viscosity, a viscosity at 25° C. was measured using an E type viscometer (product name: DV-II+Pro commercially available from Brookfield). A rotational speed was set so that the torque was 10% to 90%, and after 2 minutes from when measurement started, a value at which the viscosity was stable was read.
[Measurement of Weight Average Molecular Weight]

The weight average molecular weight was measured using a gel permeation chromatography system (product name: HLC-8220GPC commercially available from Tosoh Corporation). Polystyrene was used as a standard substance, and N,N-dimethylacetamide was used as a developing solvent.
[Measurement of Surface Roughness of Copper Foil]

For the surface roughness of the copper foil, an AFM (product name: Dimension Icon type SPM commercially available from Bruker AXS), and a probe (product name: TESPA (NCHV), a tip curvature radius of 10 nm and a spring constant of 42 N/m commercially available from Bruker AXS) were used, measurement was performed on a surface of the copper foil within the range of 80 μm×80 μm in a tapping mode, and the ten-point average roughness (Rz) was obtained.
[Measurement of peel strength]
1) Cast side (resin coated side) on single-sided copper-clad laminate A copper foil of a single-sided copper-clad laminate (copper foil/resin layer) was circuit-processed into lines and spaces with a width of 1.0 mm and an interval of 5.0 mm, and was then cut to a width of 8 cm and a length of 4 cm, and thereby a measurement sample 1 was prepared.

The peel strength on the cast side of the measurement sample 1 was measured by the following method.

Using a Tensilon tester (product name: Strograph VE-1D commercially available from Toyo Seiki Seisaku-Sho, Ltd.), the side of a resin layer of the measurement sample 1 was fixed to an aluminum board using a double-sided tape, the copper foil was peeled off in a 90° direction at a speed of 50 mm/min, and the median value strength at which the copper foil was peeled off from the resin layer by 10 mm was obtained. This value was set as a "peel strength 1A."
2) Cast Side (Resin Coated Side) on Double-Sided Copper-Clad Laminate Copper foils on both sides of the thermocompression bonding side and the cast side of the double-sided copper-clad laminate (copper foil/resin layer/copper foil) were circuit-processed into lines and spaces with a width of 0.8 mm and an interval of 3.0 mm. Here, circuit-processing of the double-sided copper foil was performed such that positions of lines and spaces were superimposed on both front and back sides. The sample that was circuit-processed in this manner was cut to a width of 8 cm and a length of 4 cm and thereby a measurement sample 2 was prepared.

The peel strength on the cast side of the measurement sample 2 was measured by the following method.

Using a Tensilon tester (product name: Strograph VE-1D commercially available from Toyo Seiki Seisaku-Sho, Ltd.), a copper foil surface on the thermocompression bonding side of the measurement sample 2 was fixed to an aluminum board using a double-sided tape, the copper foil was peeled off in a 90° direction at a speed of 50 mm/min, and the median value strength at which the copper foil on the resin coated side was peeled off from the resin layer by 10 mm was obtained. This value was set as a "peel strength 2A."
[Measurement of heat-resistant peel strength]
1) Cast side (resin coated side) on single-sided copper-clad laminate The measurement sample 1 prepared as described above was put into an atmospheric oven at 150° C. and left for 1,000 hours. The side of the resin layer of the measurement sample 1 after a heat treatment for 1000 hours was fixed to an aluminum board using a double-sided tape, the copper foil was peeled off in a 90° direction at a speed of 50 mm/min, and the median value strength at which the copper foil was peeled off from the resin layer by 10 mm was obtained. This value was set as a "peel strength 1B." A percentage (%) of a value obtained by dividing the peel strength 1B by the peel strength 1A (that is, peel strength 1B/peel strength 1A) was set as a "retention ratio 1."
<Determination criteria>

"Excellent": when the peel strength 1B was 0.30 kN/m or more and the retention ratio 1 was 80% or more.

"Good": when the peel strength 1B was 0.30 kN/m or more, and the retention ratio 1 was 60% or more.

"Acceptable": when the peel strength 1B was 0.30 kN/m or more, and the retention ratio 1 was 40% or more.

"Not acceptable": when the peel strength 1B was less than 0.30 kN/m.

2) Cast side (resin coated side) on double-sided copper-clad laminate

The measurement sample 2 prepared as described above was put into an atmospheric oven at 177° C. and left for 240 hours. A surface of the copper foil on the thermocompression bonding side of the measurement sample 2 after a heat treatment for 240 hours was fixed to an aluminum board using a double-sided tape, the copper foil was peeled off in a 90° direction at a speed of 50 mm/min, and the median value strength at which the copper foil on the resin coated side was peeled off from the resin layer by 10 mm was obtained. This value was set as a "peel strength 2B." A percentage (%) of a value obtained by dividing the peel strength 2B by the peel strength 2A (that is, peel strength 2B/peel strength 2A) was set as a "retention ratio 2."

<Determination criteria>

"Excellent": when the peel strength 2B was 0.50 kN/m or more, and the retention ratio 2 was 90% or more.

"Good": when the peel strength 2B was 0.50 kN/m or more, and the retention ratio 2 was 80% or more.

"Acceptable": when the peel strength 2B was 0.50 kN/m or more, and the retention ratio 2 was 70% or more.

"Not acceptable": when the peel strength 2B was less than 0.50 kN/m or the retention ratio 2 was less than 70%.

[Measurement of Glass Transition Temperature (Tg)]

A storage elastic modulus and a loss elastic modulus of a polyimide film sample with a size of 5 mm×20 mm were measured using a dynamic viscoelasticity measuring device (DMA: commercially available from UBM, product name: E4000F), from 30° C. to 400° C. at a heating rate of 4° C./min and a frequency of 11 Hz, and a temperature at which an elastic modulus change (tan δ) was a maximum was set as a glass transition temperature. Here, when the storage elastic modulus at 30° C. was $1.0 \times 10^9$ Pa or more and the storage elastic modulus at 360° C. was less than $1.0 \times 10^8$ Pa, it was determined as "thermoplastic." When the storage elastic modulus at 30° C. was $1.0 \times 10^9$ Pa or more and the storage elastic modulus at 360° C. was $1.0 \times 10^8$ Pa or more, it was determined as "non-thermoplastic."

[Visibility]

A total light transmittance and a haze according to JISK7136 (turbidity=diffused light transmittance/total light transmittance) of a sample with a thickness of about 25 μm and a size of 30 mm×30 mm obtained by cutting a polyimide film were measured using a turbidimeter (product name: HAZE METER NDH5000 commercially available from Nippon Denshoku Industries Co., Ltd.).

[Measurement of Dielectric Constant and Dielectric Loss Tangent]

A dielectric constant and a dielectric loss tangent of the polyimide film at a frequency of 10 GHz were measured using a vector network analyzer (product name: E8363C commercially available from Agilent) and a split post dielectric resonator (SPDR resonator). Here, the polyimide film used for measurement was left for 24 hours under conditions of a temperature of 24 to 26° C. and a humidity of 45 to 55%.

Abbreviations used in examples and comparative examples indicate the following compounds.

m-TB: 2,2'-dimethyl-4,4'-diaminobiphenyl
PDA: para-phenylenediamine
APAB: 4-aminophenyl-4'-aminobenzoate
MABA: 2'-methoxy-4,4'-diaminobenzanilide
TPE-R: 1,3-bis(4-aminophenoxy)benzene
APB: 1,3-bis(3-aminophenoxy)benzene
TPE-Q: 1,4-bis(4-aminophenoxy)benzene
BAPP: 2,2-bis[4-(4-aminophenoxy)phenyl]propane
PMDA: pyromellitic acid dianhydride
BPDA: 3,3',4,4'-biphenyl tetracarboxylic acid dianhydride
DMAc: N,N-dimethylacetamide
Copper foil: Rz=0.35 μm, thickness of 12 μm Example 1

Under a nitrogen stream, 0.5715 g of m-TB (0.0027 mole), 14.958 g of TPE-R (0.0512 mole) and 170 g of DMAc were put into a 300 ml separable flask, and stirring was performed at room temperature for dissolving. Next, after 3.489 g of PMDA (0.0160 mole) and 10.982 g of BPDA (0.0373 mole) were added thereto, stirring was continued at room temperature for 3 hours, a polymerization reaction was caused, and a polyamide acid solution a was obtained. The solution viscosity of the polyamide acid solution a was 6,700 cps, and the weight average molecular weight was 163,400.

Examples 2 to 12

Polyamide acid solutions b to k and m were prepared in the same manner as in Example 1 except that raw material compositions shown in Table 1 and Table 2 were used and the viscosity was measured.

TABLE 1

| Examples | Polyamide acid solution | Viscosity [cps] | Weight average molecular weight | Diamine component | | Acid anhydride | Solvent DMAc [g] (solid content; mass %) |
|---|---|---|---|---|---|---|---|
| | | | | Flexible diamine (mole) | Rigid diamine (mole) | component Tetracarboxylic acid (mole) | |
| 1 | a | 6,700 | 163,400 | TPE-R (0.0512) | m-TB (0.0027) | PMDA (0.0160) BPDA (0.0373) | 170 (15) |
| 2 | b | 5,800 | 238,200 | TPE-R (0.0465) | m-TB (0.0082) | PMDA (0.0162) BPDA (0.0378) | 170 (15) |
| 3 | c | 6,200 | 155,200 | TPE-R (0.0441) | m-TB (0.0110) | PMDA (0.0163) BPDA (0.0381) | 170 (15) |

TABLE 1-continued

| Examples | Polyamide acid solution | Viscosity [cps] | Weight average molecular weight | Diamine component Flexible diamine (mole) | Rigid diamine (mole) | Acid anhydride component Tetracarboxylic acid (mole) | Solvent DMAc [g] (solid content; mass %) |
|---|---|---|---|---|---|---|---|
| 4 | d | 7,200 | 112,000 | TPE-R (0.0234) | m-TB (0.0351) | PMDA (0.0174) BPDA (0.0405) | 170 (15) |
| 5 | e | 8,900 | 146,900 | TPE-R (0.0519) | m-TB (0.0027) | PMDA (0.0216) BPDA (0.0324) | 170 (15) |
| 6 | f | 9,500 | 181,700 | TPE-R (0.0495) | m-TB (0.0055) | PMDA (0.0218) BPDA (0.0327) | 170 (15) |
| 7 | g | 8,400 | 182,400 | TPE-R (0.0447) | m-TB (0.0112) | PMDA (0.0221) BPDA (0.0332) | 170 (15) |

TABLE 2

| Examples | Polyamide acid solution | Viscosity [cps] | Weight average molecular weight | Diamine component Flexible diamine (mole) | Rigid diamine (mole) | Acid anhydride component Tetracarboxylic acid (mole) | Solvent DMAc [g] (solid content; mass %) |
|---|---|---|---|---|---|---|---|
| 8 | h | 6,800 | 146,900 | TPE-R (0.0453) | m-TB (0.0113) | PMDA (0.0280) BPDA (0.0280) | 170 (15) |
| 9 | i | 113,000 | 268,900 | APB (0.0240) | m-TB (0.0360) | PMDA (0.0300) BPDA (0.0300) | 170 (15) |
| 10 | j | 7,400 | 163,400 | TPE-R (0.0459) | m-TB (0.0115) | PMDA (0.0341) BPDA (0.0227) | 170 (15) |
| 11 | k | 5,500 | 171,400 | TPE-R (0.0458) | PDA (0.0115) | PMDA (0.0170) BPDA (0.0396) | 170 (15) |
| 12 | m | 67,500 | 311,100 | TPE-R (0.0433) | MABA (0.0108) | PMDA (0.0160) BPDA (0.0376) | 170 (15) |

Synthesis Example 1

Under a nitrogen stream, 16.064 g of TPE-R (0.0550 mole) and 170 g of DMAc were put into a 300 ml separable flask and stirring was performed at room temperature for dissolving. Next, after 5.933 g of PMDA (0.0272 mole) and 8.003 g of BPDA (0.0272 mole) were added thereto, stirring was continued at room temperature for 3 hours, a polymerization reaction was caused, and a polyamide acid solution n was obtained. The solution viscosity of the polyamide acid solution n was 7,400 cps.

Synthesis Examples 2 to 6

Polyamide acid solutions o to s were prepared in the same manner as in Synthesis Example 1 except that raw material compositions shown in Table 3 were used, and the viscosity was measured.

TABLE 3

| Synthesis Examples | Polyamide acid solution (cps) | Diamine component Flexible diamine (mole) | Rigid diamine (mole) | Acid anhydride component Tetracarboxylic acid (mole) | Solvent DMAc [g] (solid content; mass %) |
|---|---|---|---|---|---|
| 1 | n (7,400) | TPE-R (0.0550) | — | PMDA (0.0272) BPDA (0.0272) | 170 (15) |
| 2 | o (3,300) | TPE-R (0.0247) BAPP (0.0247) | — | PMDA (0.0246) BPDA (0.0246) | 170 (15) |

TABLE 3-continued

| Synthesis Examples | Polyamide acid solution (cps) | Diamine component | | Acid anhydride component Tetra-carboxylic acid (mole) | Solvent DMAc [g] (solid content; mass %) |
|---|---|---|---|---|---|
| | | Flexible diamine (mole) | Rigid diamine (mole) | | |
| 3 | p (4,000) | BAPP (0.0447) | — | PMDA (0.0177) BPDA (0.0265) | 170 (15) |
| 4 | q (4,500) | BAPP (0.0479) | — | PMDA (0.0474) | 170 (15) |
| 5 | r (8,100) | TPE-Q (0.0442) | m-TB (0.0110) | PMDA (0.0163) BPDA (0.0381) | 170 (15) |
| 6 | s (22,000) | — | m-TB (0.0702) | PMDA (0.0692) | 170 (15) |

Example 13

The polyamide acid solution c was uniformly applied to the copper foil so that the thickness after a heat treatment became about 2 μm, and a solvent was removed by heating and drying at 120° C. for 1 minute. The polyamide acid solution s was uniformly applied thereto so that the thickness after a heat treatment became about 25 μm, and a solvent was removed by heating and drying a 120° C. for 3 minutes. Then, the temperature was gradually raised from 130° C. to 360° C., imidization was performed, and thereby a single-sided copper-clad laminate 1 was prepared. Evaluation results of the single-sided copper-clad laminate 1 are shown in Table 4.

Example 14

A single-sided copper-clad laminate 2 was prepared in the same manner as in Example 13 except that the polyamide acid solution d was used in place of the polyamide acid solution c. Evaluation results of the single-sided copper-clad laminate 2 are shown in Table 4.

Example 15

A single-sided copper-clad laminate 3 was prepared in the same manner as in Example 13 except that the polyamide acid solution j was used in place of the polyamide acid solution c. Evaluation results of the single-sided copper-clad laminate 3 are shown in Table 4.

Comparative Example 1

A single-sided copper-clad laminate 4 was prepared in the same manner as in Example 13 except that the polyamide acid solution n was used in place of the polyamide acid solution c. Evaluation results of the single-sided copper-clad laminate 4 are shown in Table 4.

Comparative Example 2

A single-sided copper-clad laminate 5 was prepared in the same manner as in Example 13 except that the polyamide acid solution o was used in place of the polyamide acid solution c. Evaluation results of the single-sided copper-clad laminate 5 are shown in Table 4.

Comparative Example 3

A single-sided copper-clad laminate 6 was prepared in the same manner as in Example 13 except that the polyamide acid solution p was used in place of the polyamide acid solution c. Evaluation results of the single-sided copper-clad laminate 6 are shown in Table 4.

Comparative Example 4

A single-sided copper-clad laminate 7 was prepared in the same manner as in Example 13 except that the polyamide acid solution q was used in place of the polyamide acid solution c. Evaluation results of the single-sided copper-clad laminate 7 are shown in Table 4.

TABLE 4

| | Single-sided copper-clad laminate | Peel strength [kN/m] | | Retention ratio [%] |
|---|---|---|---|---|
| | | 1A | 1B | Retention ratio 1 |
| Example 13 | 1 | 1.02 | 0.83 | 82 |
| Example 14 | 2 | 0.54 | 0.54 | 100 |
| Example 15 | 3 | 0.76 | 0.41 | 54 |
| Comparative Example 1 | 4 | 0.94 | 0.29 | 31 |
| Comparative Example 2 | 5 | 0.72 | 0.29 | 40 |
| Comparative Example 3 | 6 | 0.91 | 0.29 | 32 |
| Comparative Example 4 | 7 | 1.29 | 0.27 | 21 |

Example 16

The polyamide acid solution a was uniformly applied to the copper foil so that the thickness after curing became about 2 μm, and a solvent was then removed by heating and drying at 120° C. for 1 minute. The polyamide acid solution s was uniformly applied thereto so that the thickness after curing became about 18 μm, and a solvent was then removed by heating and drying at 120° C. for 3 minutes. In addition, the polyamide acid solution a was uniformly applied thereto so that the thickness after curing became about 2 μm and a solvent was then removed by heating and drying at 120° C. for 1 minute. Then, a heat treatment was gradually performed from 130° C. to 360° C., imidization was completed, and thereby a single-sided copper-clad laminate 8 was prepared. The copper foil was laminated on the polyimide insulating layer side of the single-sided copper-clad laminate 8, and thermocompression bonding was performed under conditions of a temperature of 310° C. and a pressure of 6.7 MPa for 15 minutes, and thereby a double-sided copper-clad laminate 8 was prepared. Evaluation results of the double-sided copper-clad laminate 8 are shown in Table 5.

Example 17

A single-sided copper-clad laminate 9 and a double-sided copper-clad laminate 9 were prepared in the same manner as in Example 16 except that the polyamide acid solution b was used in place of the polyamide acid solution a. Evaluation results of the double-sided copper-clad laminate 9 are shown in Table 5.

Example 18

A single-sided copper-clad laminate 10 and a double-sided copper-clad laminate 10 were prepared in the same manner as in Example 16 except that the polyamide acid solution c was used in place of the polyamide acid solution a. Evaluation results of the double-sided copper-clad laminate 10 are shown in Table 5.

Example 19

A single-sided copper-clad laminate 11 was prepared in the same manner as in Example 16 except that the polyamide acid solution e was used in place of the polyamide acid solution a. In addition, a double-sided copper-clad laminate 11 was prepared in the same manner as in Example 16 except that the single-sided copper-clad laminate 11 was used, and thermocompression bonding was performed for 15 minutes under conditions of a temperature of 330° C. and a pressure of 6.7 MPa. Evaluation results of the double-sided copper-clad laminate 11 are shown in Table 5.

Example 20

A single-sided copper-clad laminate 12 and a double-sided copper-clad laminate 12 were prepared in the same manner as in Example 16 except that the polyamide acid solution f was used in place of the polyamide acid solution a. Evaluation results of the double-sided copper-clad laminate 12 are shown in Table 5.

Example 21

A single-sided copper-clad laminate 13 and a double-sided copper-clad laminate 13 were prepared in the same manner as in Example 16 except that the polyamide acid solution g was used in place of the polyamide acid solution a. Evaluation results of the double-sided copper-clad laminate 13 are shown in Table 5.

Example 22

A single-sided copper-clad laminate 14 was prepared in the same manner as in Example 16 except that the polyamide acid solution h was used in place of the polyamide acid solution a. In addition, a double-sided copper-clad laminate 14 was prepared in the same manner as in Example 16 except that the single-sided copper-clad laminate 14 was used, and thermocompression bonding was performed for 15 minutes under conditions of a temperature of 330° C. and a pressure of 6.7 MPa. Evaluation results of the double-sided copper-clad laminate 14 are shown in Table 5.

Example 23

A single-sided copper-clad laminate 15 and a double-sided copper-clad laminate 15 were prepared in the same manner as in Example 16 except that the polyamide acid solution i was used in place of the polyamide acid solution a. Evaluation results of the double-sided copper-clad laminate 15 are shown in Table 5.

Comparative Example 5

A single-sided copper-clad laminate 16 was prepared in the same manner as in Example 16 except that the polyamide acid solution q was used in place of the polyamide acid solution a. In addition, a double-sided copper-clad laminate 16 was prepared in the same manner as in Example 16 except that the single-sided copper-clad laminate 16 was used, and thermocompression bonding was performed for 15 minutes under conditions of a temperature of 390° C. and a pressure of 6.7 MPa. Evaluation results of the double-sided copper-clad laminate 16 are shown in Table 5.

Comparative Example 6

A single-sided copper-clad laminate 17 was prepared in the same manner as in Example 16 except that the polyamide acid solution r was used in place of the polyamide acid solution a. In addition, a double-sided copper-clad laminate 17 was prepared in the same manner as in Example 16 except that the single-sided copper-clad laminate 17 was used and thermocompression bonding was performed for 15 minutes under conditions of a temperature of 350° C. and a pressure of 6.7 MPa. The copper foil on the thermocompression bonding side of the double-sided copper-clad laminate 17 was easily peeled off by hand, and the copper foil on the thermocompression bonding side was not circuit-processed.

TABLE 5

| Double-sided copper-clad laminate | Peel strength [kN/m] | | Retention ratio [%] |
|---|---|---|---|
| | 2A | 2B | Retention ratio 2 |
| Example 16 | 8 | 1.04 | 0.92 | 88 |
| Example 17 | 9 | 1.20 | 1.20 | 100 |
| Example 18 | 10 | 1.00 | 0.99 | 99 |
| Example 19 | 11 | 0.90 | 0.75 | 83 |
| Example 20 | 12 | 1.04 | 0.74 | 71 |
| Example 21 | 13 | 1.11 | 0.89 | 80 |
| Example 22 | 14 | 0.88 | 0.80 | 91 |
| Example 23 | 15 | 1.60 | 1.41 | 88 |
| Comparative Example 5 | 16 | 1.50 | 0.99 | 66 |

Example 24

The polyamide acid solution a was uniformly applied to the copper foil, a solvent was removed by heating and drying at 120° C. for 3 minutes so that the thickness after a heat treatment became about 25 μm. Then, the temperature was gradually raised from 130° C. to 360° C., imidization was performed, and thereby a single-sided copper-clad laminate 18 was prepared. The copper foil of the single-sided copper-clad laminate 18 was removed by etching, and thereby a polyimide film 18 was prepared. Evaluation results of the polyimide film 18 are shown in Table 6.

Examples 25 to 33

Polyimide films 19 to 27 were prepared in the same manner as in Example 24 except that the polyamide acid solutions b to j were used. Evaluation results of the polyimide films 19 to 27 are shown in Table 6.

TABLE 6

| | Polyamide acid solution | Polyamide film | Tg [° C.] | Storage elastic modulus [Pa] | | Dielectric properties (10 GHz) | |
|---|---|---|---|---|---|---|---|
| | | | | 30° C. | 360° C. | Dielectric constant | Dielectric loss tangent |
| Example 24 | a | 18 | 242 | $4.3 \times 10^9$ | $1.4 \times 10^7$ | 3.27 | 0.0031 |
| Example 25 | b | 19 | 242 | $3.6 \times 10^9$ | $1.1 \times 10^7$ | 3.25 | 0.0027 |
| Example 26 | c | 20 | 244 | $3.8 \times 10^9$ | $8.2 \times 10^6$ | 3.30 | 0.0026 |
| Example 27 | d | 21 | 266 | $4.3 \times 10^9$ | $7.1 \times 10^7$ | 3.56 | 0.0025 |
| Example 28 | e | 22 | 256 | $3.1 \times 10^9$ | $3.3 \times 10^7$ | 3.27 | 0.0034 |
| Example 29 | f | 23 | 248 | $4.1 \times 10^9$ | $3.2 \times 10^7$ | 3.32 | 0.0031 |
| Example 30 | g | 24 | 250 | $3.6 \times 10^9$ | $6.3 \times 10^7$ | 3.33 | 0.0028 |
| Example 31 | h | 25 | 264 | $3.5 \times 10^9$ | $7.3 \times 10^7$ | 3.39 | 0.0035 |
| Example 32 | i | 26 | 266 | $3.7 \times 10^9$ | $8.6 \times 10^6$ | 3.35 | 0.0040 |
| Example 33 | j | 27 | 279 | $4.1 \times 10^9$ | $7.9 \times 10^7$ | 3.43 | 0.0040 |

Example 34

The polyamide acid solution a was uniformly applied to the copper foil so that the thickness after curing became about 2 μm, and a solvent was then removed by heating and drying at 120° C. for 1 minute. The polyamide acid solution s was uniformly applied thereto so that the thickness after curing became about 18 μm and a solvent was then removed by heating and drying at 120° C. for 3 minutes. In addition, the polyamide acid solution a was uniformly applied thereto so that the thickness after curing became about 2 μm and a solvent was then removed by heating and drying at 120° C. for 1 minute. Then, a heat treatment was gradually performed from 130° C. to 360° C., imidization was completed, and thereby a single-sided copper-clad laminate 28 was prepared. The copper foil of the single-sided copper-clad laminate 28 was removed by etching and thereby a polyimide film 28 was prepared. In the polyimide film 28, the total light transmittance was 73%, and the haze was 54%.

Example 35

A polyimide film 29 was prepared in the same manner as in Example 34 except that the polyamide acid solution f was used in place of the polyamide acid solution a. In the polyimide film 29, the total light transmittance was 74%, and the haze was 56%.

Example 36

A polyimide film 30 was prepared in the same manner as in Example 34 except that the polyamide acid solution g was used in place of the polyamide acid solution a. In the polyimide film 30, the total light transmittance was 74%, and the haze was 55%.

Reference Example 1

A polyimide film 31 was prepared in the same manner as in Example 34 except that the polyamide acid solution q was used in place of the polyamide acid solution a. In the polyimide film 31, the total light transmittance was 77%, and the haze was 50%.

Example 37

A polyimide film 32 was prepared in the same manner as in Example 24 except that the polyamide acid solution k was used. In the polyimide film 32, the dielectric constant was 3.40, and the dielectric loss tangent was 0.0032.

Example 38

A polyimide film 34 was prepared in the same manner as in Example 24 except that the polyamide acid solution m was used. In the polyimide film 34, the dielectric constant was 3.52, and the dielectric loss tangent was 0.0037.

Comparative Example 7

A polyimide film 35 was prepared in the same manner as in Example 24 except that the polyamide acid solution q was used. In the polyimide film 35, the dielectric constant was 3.16, and the dielectric loss tangent was 0.0057.

While embodiments of the present invention have been described above in detail for the purpose of exemplification, the present invention is not limited to the embodiments, and various modifications can be made.

Priority is claimed on Japanese Patent Application No. 2016-54299, filed Mar. 17, 2016, the content of which is incorporated herein by reference.

The invention claimed is:

1. A polyamide acid obtained by reacting a diamine component with an acid anhydride component,
wherein the polyamide acid is a precursor of a thermoplastic polyimide,
wherein the diamine component includes at least one selected from among diamine compounds represented by the following general formulae (1) to (7) within the range of 79.9964 to 95 parts by mole in total and at least one selected from among diamine compounds represented by the following general formula (8) within the range of 5 to 20.0036 parts by mole in total with respect to 100 parts by mole of all diamine components, and
wherein the acid anhydride component includes biphenyl tetracarboxylic acid dianhydride within the range of 40 to 100 parts by mole, and pyromellitic acid dianhydride within the range of 0 to 60 parts by mole with respect to 100 parts by mole of all acid anhydride components,

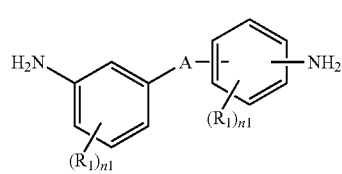

(1)

wherein the thermoplastic polyimide includes a diamine residue derived from at least one selected from among diamine compounds represented by the following general formulae (1) to (7) within the range of 79.9964 to 95 parts by mole in total and a diamine residue of at least one selected from among diamine compounds represented by the following general formula (8) within the range of 5 to 20.0036 parts by mole in total with respect to 100 parts by mole of all diamine residues, and wherein the thermoplastic polyimide includes a tetracarboxylic acid residue derived from biphenyl tetracarboxylic acid dianhydride within the range of 40 to 100 parts by mole and a tetracarboxylic acid residue derived from pyromellitic acid dianhydride within the range of 0 to 60 parts by mole with respect to 100 parts by mole of all tetracarboxylic acid residues,

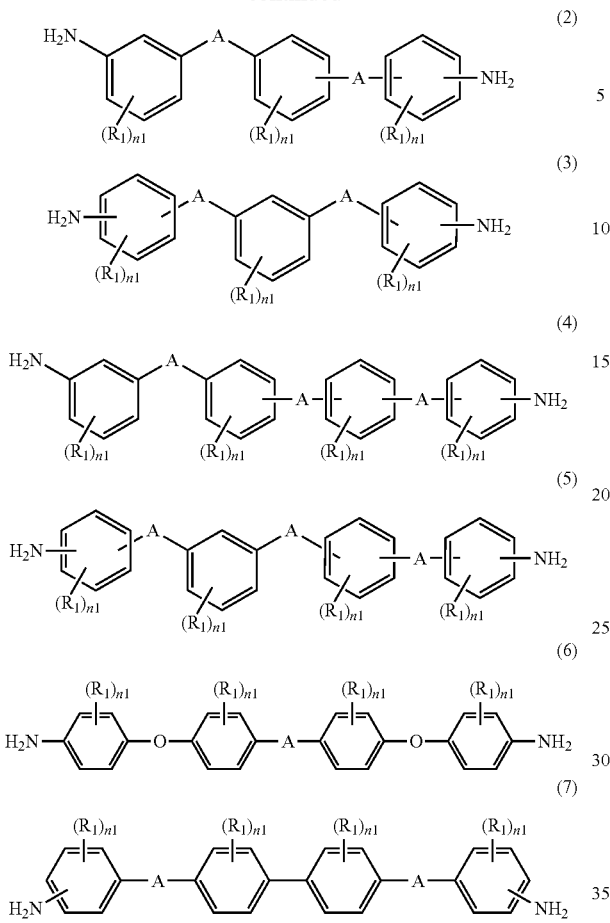

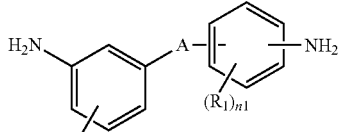

(1)

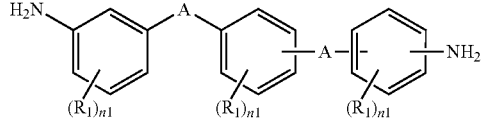

(2)

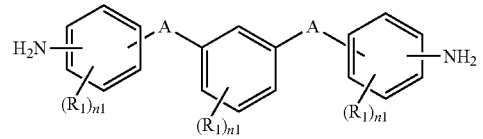

(3)

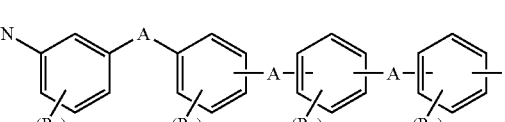

(4)

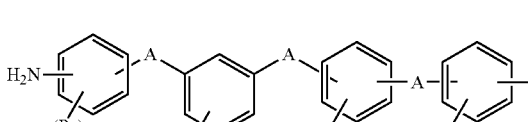

(5)

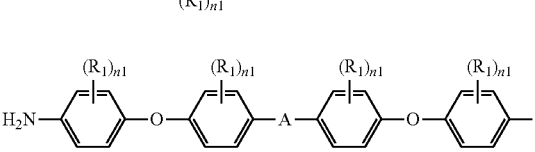

(6)

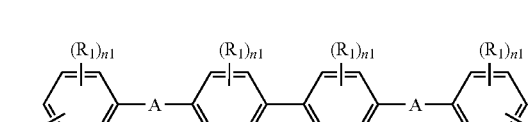

(7)

in formulae (1) to (7), $R_1$ independently represents a monovalent hydrocarbon group having 1 to 6 carbon atoms or an alkoxy group, linking groups A independently represent a divalent group selected from among —O—, —S—, —CO—, —SO—, —SO$_2$—, —COO—, —CH$_2$—, —C(CH$_3$)$_2$—, —NH— and —CONH—, and $n_1$ independently represents an integer of 0 to 4, and here, in the case of formula (6), the linking group A is a divalent group selected from among —O—, —SO$_2$—, or —CO—, parts in formula (3) that are the same as those in formula (2) are excluded, and parts in formula (5) that are the same as those in formula (4) are excluded,

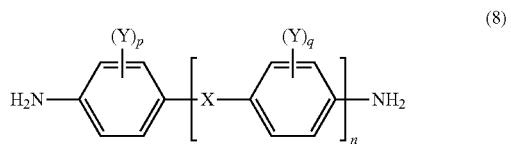

(8)

in formula (8), a linking group X represents a single bond or —CONH—, each Y independently represents hydrogen, a monovalent hydrocarbon group having 1 to 3 carbon atoms or an alkoxy group, n represents an integer of 1 or 2, and p and q independently represent an integer of 0 to 4.

2. A thermoplastic polyimide that includes a diamine residue derived from a diamine component and a tetracarboxylic acid residue derived from an acid anhydride component, in formulae (1) to (7), $R_1$ independently represents a monovalent hydrocarbon group having 1 to 6 carbon atoms or an alkoxy group, linking groups A independently represent a divalent group selected from among —O—, —S—, —CO—, —SO—, —SO$_2$—, —COO—, —CH$_2$—, —C(CH$_3$)$_2$—, —NH— and —CONH—, and n$_1$ independently represents an integer of 0 to 4, and here, in the case of formula (6), the linking group A is a divalent group selected from among —O—, —SO$_2$—, or —CO—, parts in formula (3) that are the same as those in formula (2) are excluded, and parts in formula (5) that are the same as those in formula (4) are excluded,

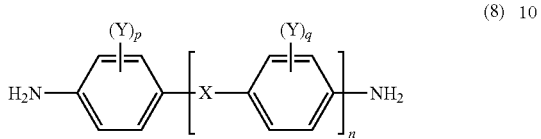

(8)

in formula (8), a linking group X represents a single bond or —CONH—, each Y independently represents hydrogen, a monovalent hydrocarbon group having 1 to 3 carbon atoms or an alkoxy group, n represents an integer of 1 or 2, and p and q independently represent an integer of 0 to 4.

3. A resin film that including a single layer or a plurality of polyimide layers,
wherein at least one layer among the polyimide layers is formed of the thermoplastic polyimide according to claim 2.

4. A metal-clad laminate including an insulating resin layer and a metal layer,
wherein the insulating resin layer includes a single layer or a plurality of polyimide layers, and
wherein a polyimide layer in contact with the metal layer is formed of the thermoplastic polyimide according to claim 2.

5. The metal-clad laminate according to claim 4,
wherein a ten-point average roughness (Rz) of a surface of the metal layer in contact with the insulating resin layer is within the range of 0.05 to 1.0 μm.

6. A circuit board obtained by processing the metal layer of the metal-clad laminate according to claim 4 into a wiring.

7. The polyamide acid according to claim 1,
wherein a storage elastic modulus at 30° C. of the thermoplastic polyimide is 1.0×10$^9$ Pa or more and a storage elastic modulus at 360° C. of the thermoplastic polyimide is less than 1.0×10$^8$ Pa.

8. The polyamide acid according to claim 1,
wherein a glass transition temperature of the thermoplastic polyimide is within a range of 200 to 320° C.

9. The polyamide acid according to claim 1,
wherein the acid anhydride component includes biphenyl tetracarboxylic acid dianhydride within the range of 50 to 100 parts by mole, and pyromellitic acid dianhydride within the range of 0 to 50 parts by mole with respect to 100 parts by mole of all acid anhydride components.

10. The thermoplastic polyimide according to claim 2,
wherein a storage elastic modulus at 30° C. of the thermoplastic polyimide is 1.0×10$^9$ Pa or more and a storage elastic modulus at 360° C. of the thermoplastic polyimide is less than 1.0×10$^8$ Pa.

11. The thermoplastic polyimide according to claim 2,
wherein a glass transition temperature of the thermoplastic polyimide is within a range of 200 to 320° C.

12. The thermoplastic polyimide according to claim 2,
wherein the acid anhydride component includes biphenyl tetracarboxylic acid dianhydride within the range of 50 to 100 parts by mole, and pyromellitic acid dianhydride within the range of 0 to 50 parts by mole with respect to 100 parts by mole of all acid anhydride components.

13. A resin film, comprising:
a base film layer; and
an adhesive layer laminated on one side or both sides of the base film layer,
wherein the base film layer is a low thermal expansion polyimide layer having a coefficient of thermal expansion (CTE) that is 30×10$^{-6}$ (1/K) or less, and
the adhesive layer is formed of the thermoplastic polyimide according to claim 2.

14. The resin film according to claim 13,
wherein a dielectric loss tangent (Tanδ) at 10 GHz of the adhesive layer is 0.035 or less.

15. A metal-clad laminate including an insulating resin layer and a metal layer,
wherein the insulating resin layer includes a base film layer and an adhesive layer laminated on one side or both sides of the base film layer,
the base film layer is a low thermal expansion polyimide layer having a coefficient of thermal expansion (CTE) that is 30×10$^{-6}$ (1/K) or less, and
the adhesive layer is formed of the thermoplastic polyimide according to claim 2.

16. The metal-clad laminate according to claim 15,
wherein a dielectric loss tangent (Tanδ) at 10 GHz of the adhesive layer is 0.035 or less.

17. The metal-clad laminate according to claim 15,
wherein a ten-point average roughness (Rz) of a surface of the metal layer in contact with the insulating resin layer is within the range of 0.05 to 1.0 μm.

18. A circuit board obtained by processing the metal layer of the metal-clad laminate according to claim 15 into a wiring.

* * * * *